(12) United States Patent
Jensen

(10) Patent No.: US 7,826,564 B2
(45) Date of Patent: *Nov. 2, 2010

(54) COMPLEX DIGITAL PHASE LOCKED LOOP FOR USE IN A DEMODULATOR AND METHOD OF OPTIMAL COEFFICIENT SELECTION

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/234,343

(22) Filed: Sep. 19, 2008

(65) Prior Publication Data
US 2009/0016466 A1 Jan. 15, 2009

Related U.S. Application Data

(63) Continuation of application No. 10/999,531, filed on Nov. 30, 2004, now Pat. No. 7,443,930.

(51) Int. Cl.
*H03D 3/18* (2006.01)
*H03D 3/24* (2006.01)

(52) U.S. Cl. .................. 375/327; 375/326; 375/373; 375/376
(58) Field of Classification Search ................ 375/327, 375/373, 376, 326; 329/325
See application file for complete search history.

(56) References Cited

U.S. PATENT DOCUMENTS 5,912,930 A * 6/1999 Iwasaki ................. 375/329
6,310,513 B1 * 10/2001 Iemura ................. 329/304

* cited by examiner

*Primary Examiner*—Ted M Wang
(74) *Attorney, Agent, or Firm*—Garlick, Harrison & Markison; Holly L. Rudnick

(57) ABSTRACT

A complex digital phase locked loop for use in a digital demodulator includes a phase detector for producing a phase error indicative of a difference in phase between a complex digital input signal and a complex digital feedback signal. The phase error is input to a controller, which multiplies the phase error by a gain factor selected to stabilize and optimize the phase locked loop and produces an output signal for use in extracting a frequency deviation present in the complex digital input signal. The output signal is also input to a numerically controlled oscillator that tracks the phase of the complex digital input signal based on the output signal and produces the complex digital feedback signal.

15 Claims, 10 Drawing Sheets

COMPLEX DIGITAL PHASE LOCKED LOOP FOR USE IN A DEMODULATOR AND METHOD OF OPTIMAL COEFFICIENT SELECTION

CROSS REFERENCE TO RELATED APPLICATIONS

The present U.S. Utility Patent Application claims priority pursuant to 35 U.S.C. §120, as a continuation, to the following U.S. Utility Patent Application, which is hereby incorporated herein by reference in its entirety and made part of the present U.S. Utility Patent Application for all purposes:

1. U.S. Utility application Ser. No. 10/999,531, entitled "COMPLEX DIGITAL PHASE LOCKED LOOP FOR USE IN A DEMODULATOR AND METHOD OF OPTIMAL COEFFICIENT SELECTION,", filed Nov. 30, 2004, pending.

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage demodulates the filtered signal to recover the raw data in accordance with the particular wireless communication standard. Alternate designs being pursued at this time further include direct conversion radios that produce a direct frequency conversion often in a plurality of mixing steps or stages.

As an additional aspect, these designs are being pursued as a part of a drive to continually reduce circuit size and power consumption. Along these lines, such designs are being pursued with CMOS technology thereby presenting problems not addressed by prior art designs. For example, one common design goal is to provide an entire system on a single chip. The drive towards systems-on-chip solutions for wireless applications continues to replace traditionally analog signal processing tasks with digital processing to exploit the continued shrinkage of digital CMOS technology.

One approach of current designs by the applicant and assignee herein is to reduce analog signal processing performance requirements and to compensate for the relaxed performance requirements in the digital domain to provide required system performance. This approach is beneficial in that, in addition to the reduced silicon area requirements, the processing is insensitive to process and temperature variations.

Applications for which this trend is observed include RF receivers where the received signal is digitized as early as possible in the receiver chain using a high dynamic range analog-to-digital converter (ADC), and in a variety of calibration circuits of the radio where signal levels must be measured accurately over a wide range of values. This trend thus increases the demand for embedded low-power, low-voltage ADCs providing high dynamic range in the interface between the analog and digital processing. A class of ADCs capable of providing high dynamic range and particularly suitable for low-power and low-voltage implementation is known as continuous-time delta sigma analog-to-digital converters (CTΔΣADCs). These ADCs can be designed to operate with supply voltages in the range 1.2V-1.5V and current consumption as low as a few hundred μAs.

With the introduction of CTΔΣADCs, digital demodulators are being introduced in the receiver architecture to replace traditional analog demodulators. Digital processing, unlike analog processing, does not introduce DC offset into the signal. As a result, the performance of digital demodulators is typically superior to that of analog demodulators. However, the design of digital demodulators is specific to the communication standard being employed. Therefore, an appropriate demodulator design must be developed for each type of communication standard.

For example, the most widespread standard used in wireless personal area network (PAN) communication is currently Bluetooth 1.1. This standard employs the Gaussian Frequency Shift Keying (GMSK) modulation scheme, which is a constant-envelope binary modulation scheme, with a maximum raw transmission rate of 1 Megabits per second (Mpbs). Bluetooth further employs a frequency hopping scheme for the purposes of sharing the spectrum resources and increasing the robustness towards undesired interference. Bluetooth devices operate in the 2.4 GHz unlicensed industrial, scientific and medical (ISM) band and occupy an RF channel bandwidth of 1 MHz. However, an optimal digital demodulator design has yet to be developed for the Bluetooth standard.

Thus, a need exists for a digital demodulator design for application in a Bluetooth receiver.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
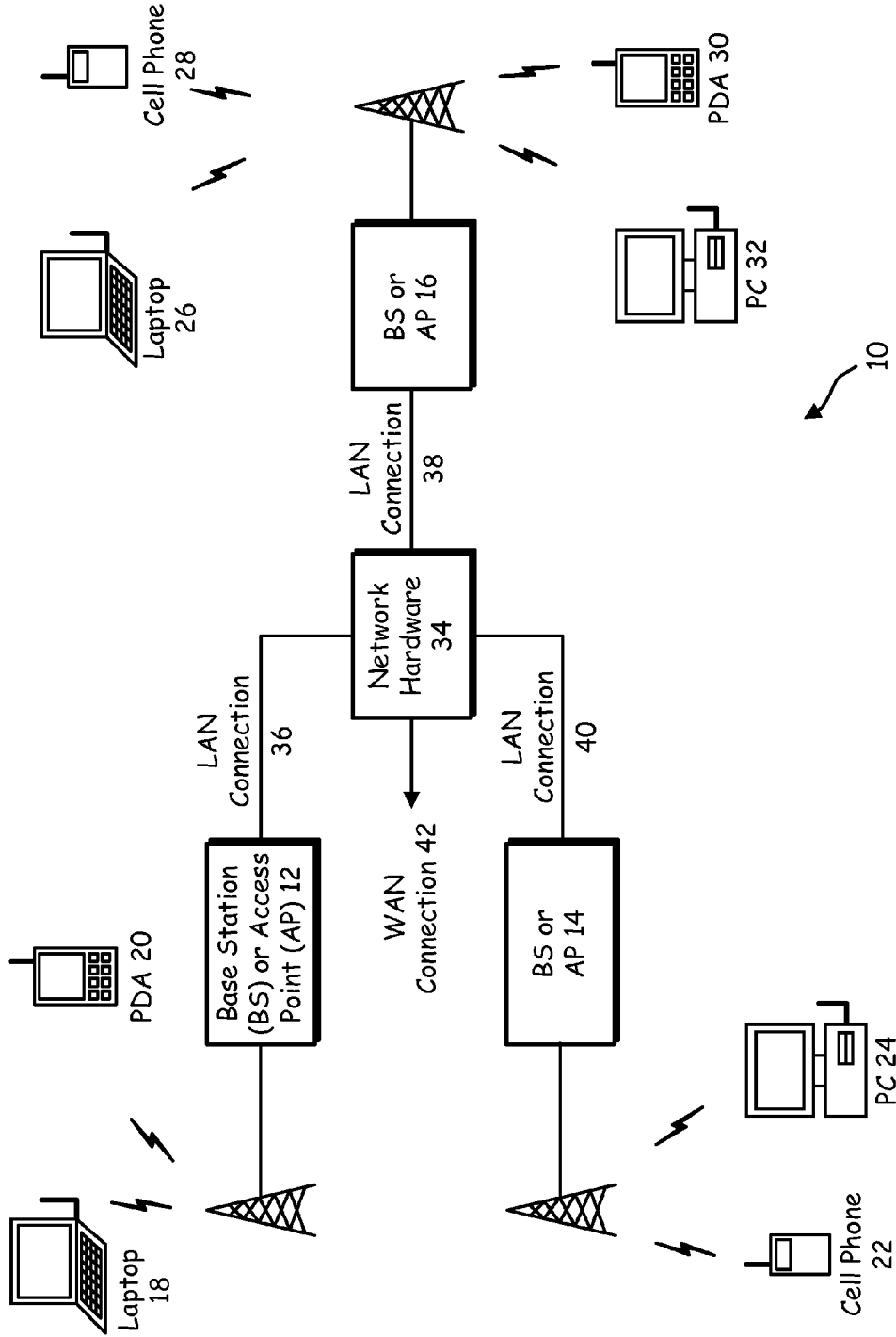
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. For example, access points are typically used in Bluetooth systems. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
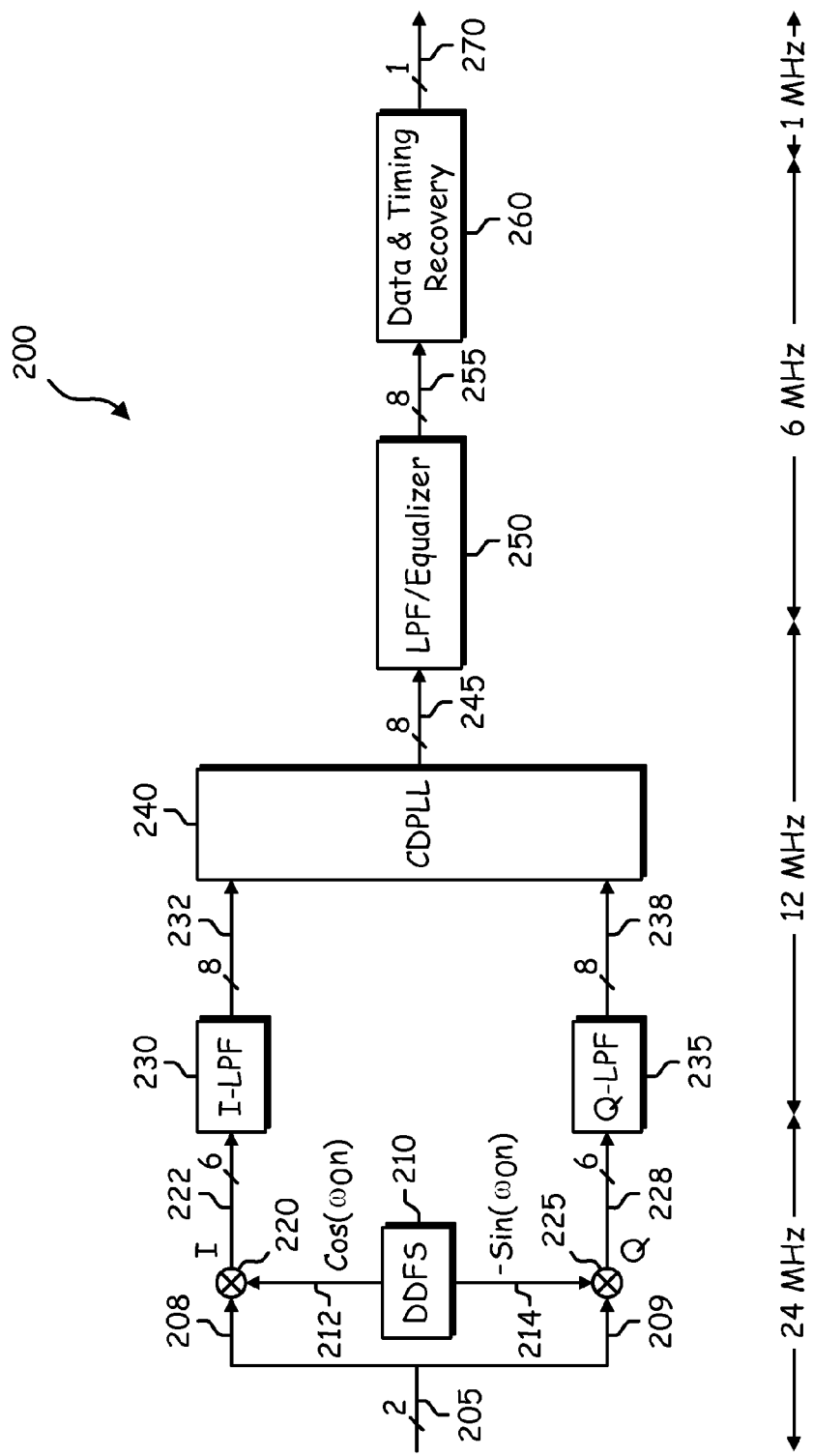
FIG. 2 is a schematic block diagram illustrating a digital demodulator for use in a receiver according to one embodiment of the present invention.

FIG. 2 illustrates a high-level architecture of an exemplary digital demodulator 200 for use in a Bluetooth receiver. The digital demodulator 200 includes a direct digital frequency synthesizer (DDFS) 210, a pair of digital multipliers 220 and 225, an in-phase low pass filter (I-LPF) 230, a quadrature-phase low pass filter (Q-LPF) 235, a complex digital phase locked loop (CDPLL) 240, an equalizer (LPF/Equalizer) 250 and a data and timing recovery circuit 260.

The digital demodulator is connected to receive a complex digital modulated signal 205. The complex digital modulated signal 205 includes an in-phase signal 208 and a quadrature-phase signal 209. In the example shown in FIG. 2, the input to the digital demodulator 200 is a 2-bit, 24 MHz digitized version of the hard-limited intermediate frequency (IF) signal centered at 2 MHz. The DDFS 210 produces outputs that are used by the pair of digital multipliers 200 and 225 to translate the complex digital modulated IF signal to a complex digital modulated baseband signal. The DDFS 210 outputs a digital cosine function 212 and a digital sine function 214. The first digital multiplier 220 multiplies the in-phase signal 208 (at IF) by the digital cosine function 212 to produce a first digital signal 222 (at baseband). The second digital multiplier 225 multiplies the quadrature-phase signal 209 (at IF) by the digital sine function 214 to produce a second digital signal 228 (at baseband). However, it should be understood that in other embodiments, the DDFS 210 may not be used or included if the input to the digital demodulator 200 is a complex digital modulated baseband signal. In addition, other IF translation circuitry may be included if the input to the digital demodulator 200 is a complex digital modulated radio frequency (RF) signal and an additional downconversion from RF to IF is required.

The I-LPF 230 is connected to receive the first digital signal 222 and is operable to filter the first digital signal 222 to produce a first filtered digital signal 232. The Q-LPF 235 is connected to receive the second digital signal 228 and is operable to filter the second digital signal 228 to produce a second filtered digital signal 238. For example, in one embodiment, the I-LPF 230 and Q-LPF 235 attenuate interferers and quantization noise from the in-phase and quadrature-phase modulated baseband signals 222 and 228, respectively, to produce the first and second filtered digital signals 232 and 238, respectively. In the exemplary embodiment shown in FIG. 2, the I-LPF 230 and Q-LPF 235 are decimation filters that operate to both perform low pass filtering and reduce the digital sampling rate. For example, the decimation filters may lower the sampling rate from 24 MHz (the sampling rate of the input to the digital demodulator 200) to 12 MHz (the sampling rate of the CDPLL 240).

The CDPLL 240 is connected to receive the first and second filtered digital signals 232 and 238, respectively, and operates to demodulate the first and second filtered digital signals 232 and 238 to produce an output signal 240 that is used by the data and timing recovery circuit 260 to extract the frequency deviations present in the complex digital input signal 205. The frequency deviations correspond to the modulation used in the transmitter (e.g., Gaussian Frequency Shift Keying "GFSK"). The output signal 245 of the CDPLL 240 is input to the LPF/Equalizer 250, which is operable to attenuate the noise component of the CDPLL output 245 and boost the gain of the parts of the signal that suffer from filtering in the transmitter and receiver. Thus, the LPF/Equalizer 250 operates as a smoothing filter that applies a smoothing function to the output 245 of the CDPLL 240 to produce a smoothed output signal 255.

In one embodiment, the LPF/Equalizer 250 is a decimation filter that operates to both perform filtering and reduce the digital sampling rate. For example, as shown in FIG. 2, the LFP/Equalizer 250 lowers the sampling rate from 12 MHz (the sampling rate of the output of the CDPLL 240) to 6 MHz (the sampling rate of the data and timing recovery circuit 260). The smoothed output signal 255 is input to the data and timing recovery circuit 260, which is operable to determine the optimal sampling points of the smoothed output signal 255 and to produce a demodulated digital signal 270. The demodulated digital signal 270 includes digital baseband bits representative of the original transmitted digital data.

Figure 3:
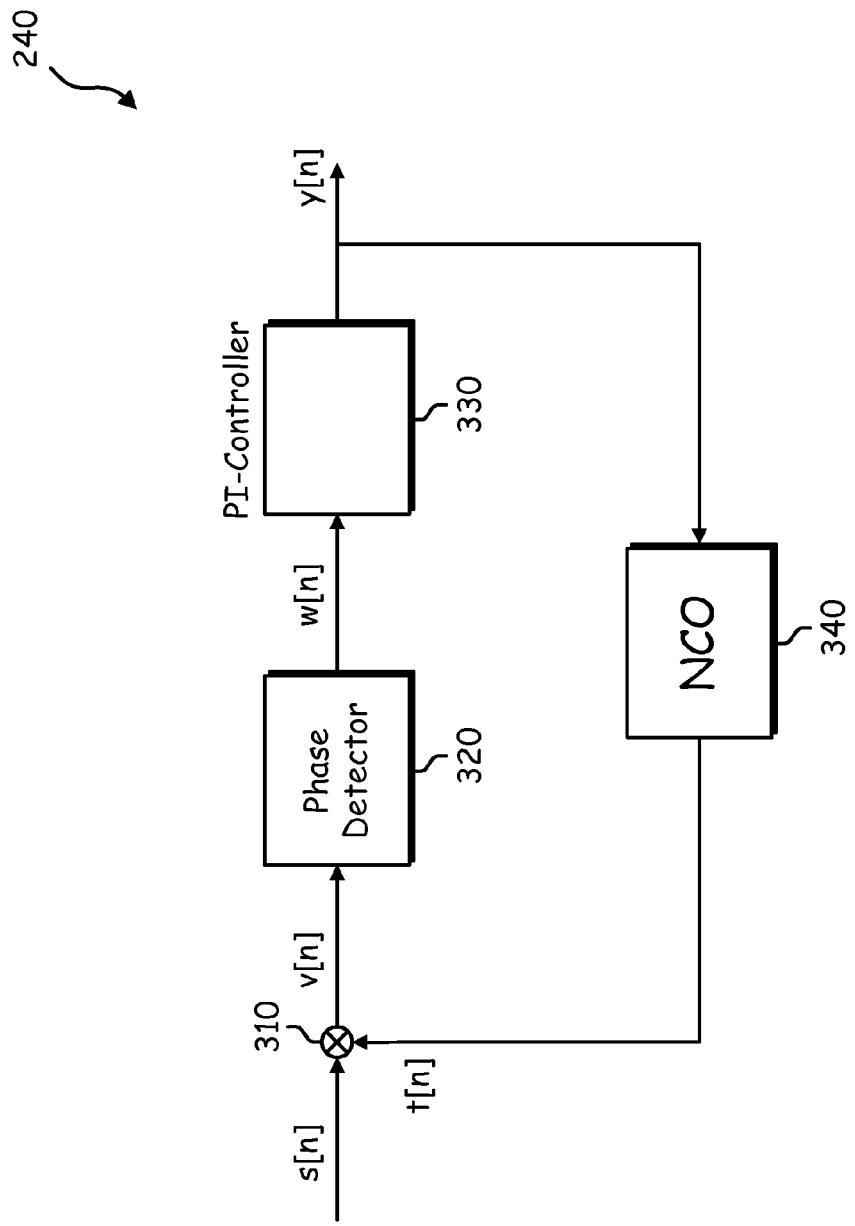
FIG. 3 is a schematic block diagram illustrating a complex digital phase locked loop for use in the digital demodulator according to one embodiment of the present invention.

FIG. 3 illustrates a top-level block diagram of a $2^{nd}$ order CDPLL 240 appropriate for application in GFSK demodulation, according to one embodiment of the invention. The CDPLL 240 includes a multiplier 310, a phase detector 320, a proportionality/integration (PI)-controller 330 and a numerically controlled oscillator (NCO) 340. The digital input signal, s[n], is assumed to be of the complex form:

$$s[n]=e^{j(\omega_{LO}n+\theta_s[n])},$$

where $\omega_{LO}$ denotes an arbitrary center frequency and $\theta_s[n]$ denotes the signal phase deviation.

The NCO 340 generates a complex digital feedback signal of the form:

$$t[n]=e^{-j(\omega_{LO}n+\theta_{NCO}[n])},$$

where $\theta_{NCO}[n]$ denotes the NCO phase deviation. The digital multiplier 310 multiples the complex digital input signal s[n] and the complex digital feedback signal t[n] to produce a multiplied digital signal v[n] of the form:

$$v[n]=e^{j(\theta_s[n]-\theta_{NCO}[n])},$$

The multiplied digital signal v[n] is input to the phase detector 320, which is operable to determine a phase error signal w[n] indicative of the difference in phase between the complex digital input signal s[n] and the complex digital feedback signal t[n]. The phase error signal w[n] has the form:

$$w[n]=\sin(\theta_s[n]-\theta_{NCO}[n]).$$

The phase error signal w[n] is input to the PI-controller 330, which is operable to multiply the phase error signal w[n] by a gain factor selected to stabilize and optimize the complex digital phase locked loop 240. The output of the PI-controller 330, y[n], is input to the NCO 340 to produce the complex digital feedback signal t[n] based on the output signal y[n]. The closed loop action of the loop causes the phase error signal w[n] to approach zero. Hence, the phase of the output signal y[n] tracks the phase of the complex digital baseband signal s[n], as desired.

As will be shown in more detail below in connection with FIGS. 6-9, a broad set of gain parameters for the PI-controller 330 exist such that the steady-state response to a frequency-step input is proportional to the magnitude of the frequency-step, and for a more restricted set of gain parameters, the CDPLL 240 achieves error-free tracking in merely three samples. To achieve these tracking properties, the purpose of the PI-controller 330 is to direct the NCO phase $\theta_{NCO}[n]$ to equal the signal phase $\theta_s[n]$ in some optimal manner determined by the gain parameter. When this "phase-lock" occurs, $$\theta_s[n] \approx \theta_{NCO}[n],$$

and thus $$w[n] \approx \theta_s[n]-\theta_{NCO}[n]=\theta_e[n],$$

where $\theta_e[n]$ is the phase error signal w[n].

Figure 4:
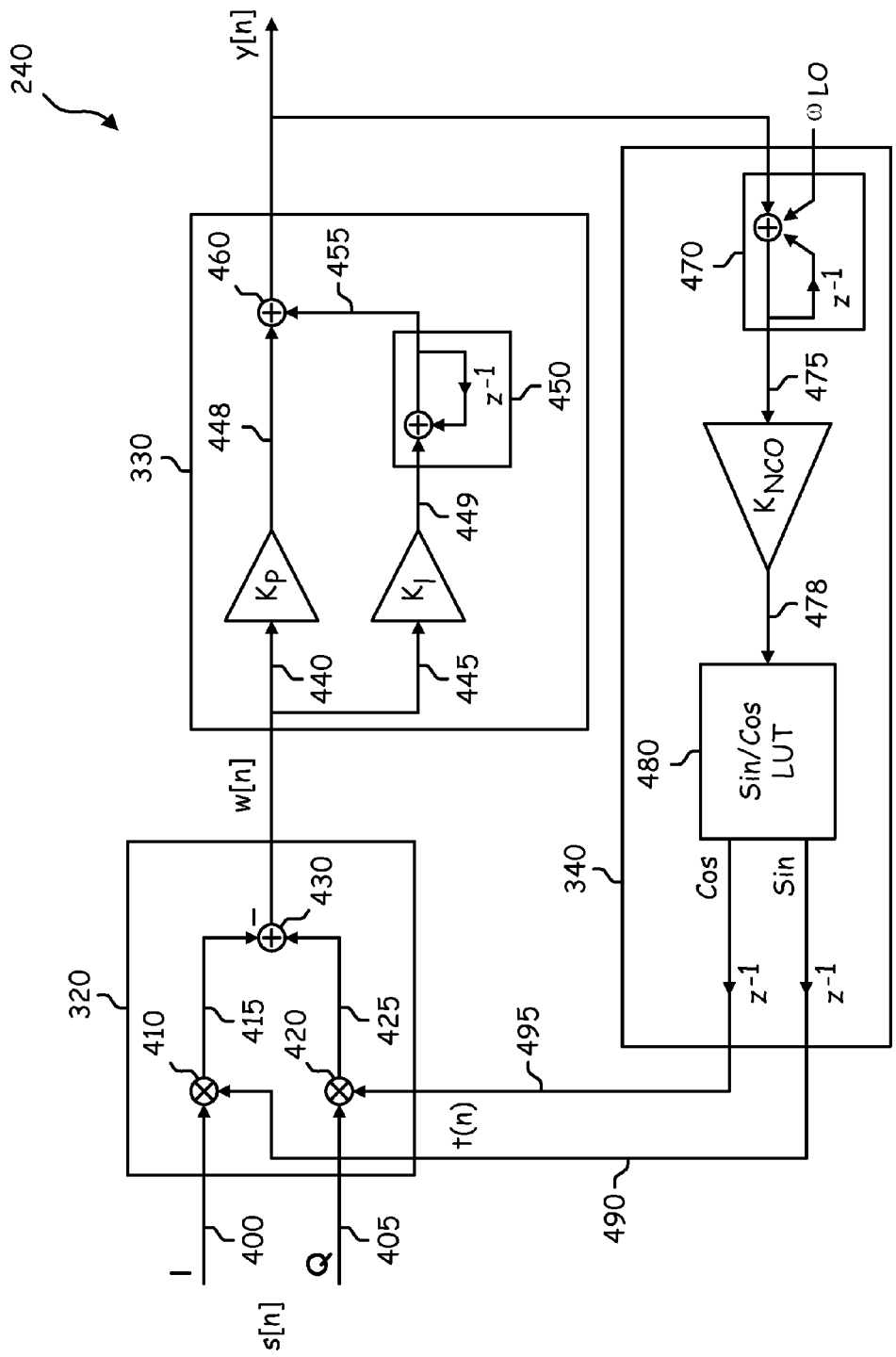
FIG. 4 is a circuit schematic illustrating an exemplary complex digital phase locked loop for use in the digital demodulator according to one embodiment of the present invention.

FIG. 4 is a circuit schematic illustrating an exemplary complex digital phase locked loop 240 for use in the digital demodulator according to one embodiment of the present invention. The input signal s[n] and NCO output t[n] are in complex form. The phase detector 320 includes the multiplier 310 shown in FIG. 3, and therefore, includes a first digital multiplier 410, a second digital multiplier 420 and a subtractor 430. The first digital multiplier 410 is connected to receive an in-phase input signal 400 (corresponding to the first filtered digital signal 232 in FIG. 2) and an in-phase feedback signal 490, and is operable to multiply the in-phase input signal 400 with the in-phase feedback signal 490 to produce a first digital signal 415. The second digital multiplier 420 is connected to receive a quadrature-phase input signal 405 (corresponding to the second filtered digital signal 238 in FIG. 2) and a quadrature-phase feedback signal 495, and is operable to multiply the quadrature-phase input signal 405 with the quadrature-phase feedback signal 495 to produce a second digital signal 425. The subtraction node 430 is connected to receive the first digital signal 415 and the second digital signal 425, and is operable to subtract the first digital signal 415 from the second digital signal 425 to produce the phase error signal w[n].

In the example shown in FIG. 4, the PI-controller 330 includes a first path 445 connected to receive the phase error w[n] and a second path 440 connected to receive the phase error w[n]. The first path 445 includes an integration gain factor $K_I$ selected to stabilize and optimize the CDPLL 240 and an integrator 450 operable to integrate a product 449 of the phase error w[n] and the integration gain factor $K_I$ to produce an integrated signal 455. The second path 440 includes a proportionality gain factor $K_P$ selected to stabilize and optimize the CDPLL 240 and an adder 460 operable to add a product 448 of the phase error w[n] and the proportionality gain factor $K_P$ and the integrated signal 455 to produce the output signal y[n].

It should be understood that in other embodiments, the PI-controller 330 may include no paths, only the first path 445, only the second path 440, or one or more additional paths with one or more corresponding additional gain factors selected to stabilize and optimize the CDPLL 240. For example, with a simple choice of gain-parameters, e.g., $(K_I, K_P, K_{NCO}) = (1.00, 1.00, 1.00)$, the CDPLL 240 can be implemented without gain-factors. However, in practice, due to implementation restrictions, the assumption of unity signal amplitude and unity NCO gain made in the above may not hold true and the PI-controller gains must be adjusted accordingly. In particular, let $K_S$ denote the input signal amplitude, i.e., $$s[n] = K_S e^{j(\omega_{LO} n + \theta_s[n])},$$

and, as before, let $K_{NCO}$ be a implicit gain associated with the NCO implementation. To design for CDPLL deadbeat response, the PI-controller gains must satisfy:

$$K_I = K_P = \frac{1}{K_S K_{NCO}}.$$

In general, to implement a second-order CDPLL 240 with PI-controller gains $(K_I, K_P)$, input signal amplitude $K_S$, and implicit NCO gain $K_{NCO}$ requires implementation of gains as follows:

$$\frac{K_P}{K_S K_{NCO}},$$

and $$\frac{K_I}{K_S K_{NCO}}.$$

The NCO 340 includes an integrator 470, an implicit gain $K_{NCO}$ and a sine/cosine look-up table (LUT) 480. The integrator 470 is connected to receive the output signal y[n] of the PI-controller 330 and an additional signal $\omega_{LO}$ that operates to remove intermediate frequencies from the output signal y[nh]. If the complex digital input signal s[n] is at baseband, the additional signal $\omega_{LO}$ is set to zero. The integrator 470 produces an integrated signal 475, which is multiplied by the intrinsic gain $K_{NCO}$ of the NCO 340 and input to the sine/cosine LUT 480. The LUT 480 is operable to compute the complex digital feedback signal t[n] based on a product 478 of the integrated signal 475 and the intrinsic gain $K_{NCO}$ of the NCO 340.

Figure 5:
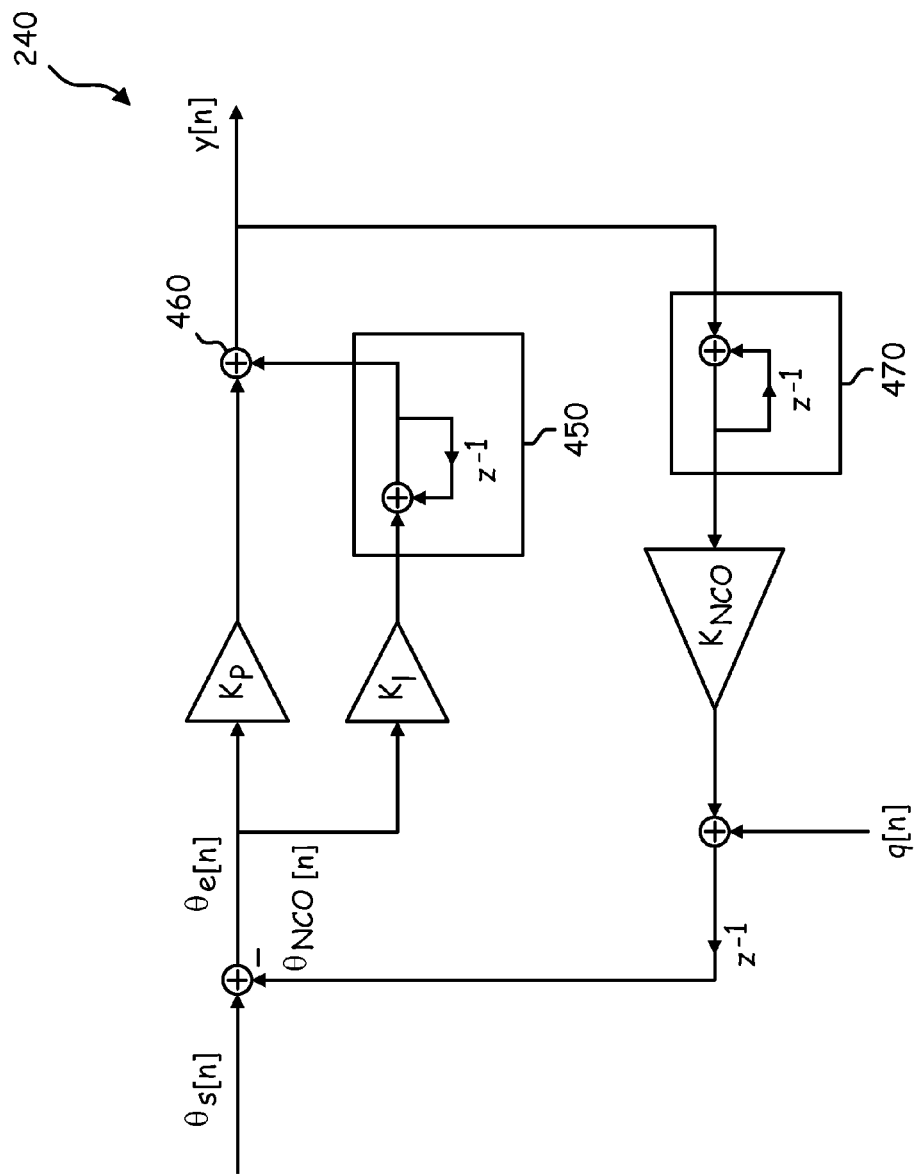
FIG. 5 illustrates a linearized model of the complex digital phase locked loop according to one embodiment of the present invention.

In phase-lock, the CDPLL 240 can be represented in linearized form as shown in FIG. 5. The term q[n] denotes additive quantization noise resulting from finite-precision representation in the LUT, and, as described above, $K_{NCO}$ denotes a possible implicit gain associated with the implementation of the LUT. From FIG. 5, it can be seen that the noise transfer function H(z) of the CDPLL 240 is of the form:

$$H(z) \equiv \frac{Y(z)}{\Theta_s(z)}$$

$$= \frac{[K_P(1-z^{-1}) + K_I](1-z^{-1})}{(1-z^{-1})^2 + [C_P(1-z^{-1}) + C_I]z^{-1}}$$

$$= \frac{K_P + K_I - (2K_P + K_I)z^{-1} + K_P z^{-2}}{1 + (C_P + C_I - 2)z^{-1} + (1 - C_P)z^{-2}},$$

where the proportionality gain coefficient $C_P = K_P \times K_{NCO}$ and the integration gain coefficient $C_I = K_I \times K_{NCO}$. The noise transfer function H(z) determines the amount of attenuation of the in-band portion of the "noise" terms $\theta_e[n]$ and q[n]. Thus, the stability of the CDPLL 240 depends upon both $C_P$ and $C_I$.

Figure 6:
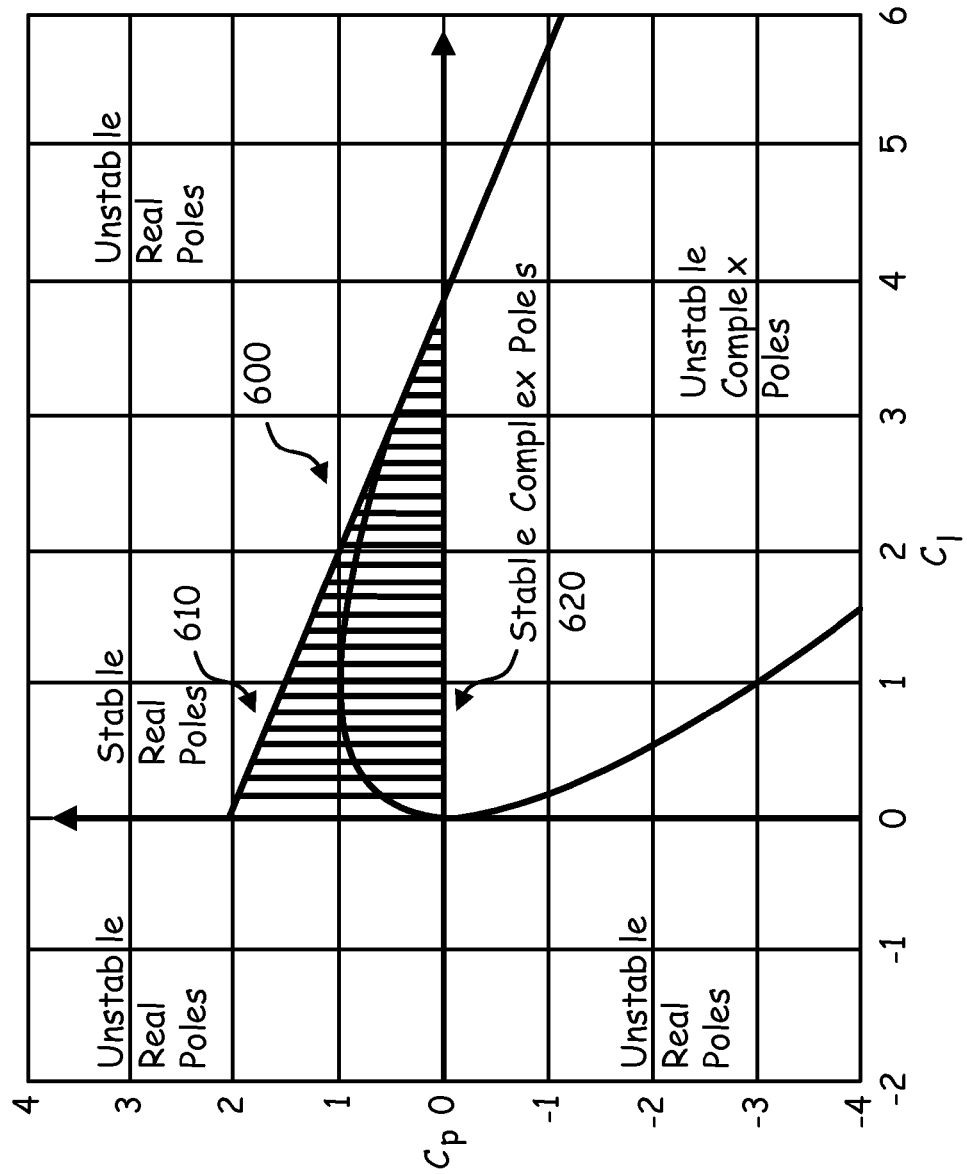
FIG. 6 is a graph illustrating an exemplary stability region of the complex digital phase locked loop according to one embodiment of the present invention.

FIG. 6 is a graph illustrating an exemplary stability region 600 of the complex digital phase locked loop according to one embodiment of the present invention. For a stability region in $R^2(C_I, C_P)$ for a discrete-time system with characteristic polynomial $$P(z) = z^2 + (C_P + C_I - 2)z + (1 - C_P),$$

the system poles are given by:

$$z = \frac{2 - C_P - C_I \pm \sqrt{D}}{2},$$

where:

$$D = (C_P + C_I - 2)^2 - 4(1 - C_P).$$

For real-valued poles:

$$D \geq 0 \Rightarrow$$

$$(C_P + C_I - 2)^2 \geq 4(1 - C_P) \Rightarrow$$

$$(C_P + C_I)^2 \geq 4C_I$$

This is trivially true for negative $C_I$ and any $C_P$. However, if $C_I \geq 0$, then $$(C_P + C_I)^2 \geq 2^2 C_I \Rightarrow$$

$$C_P + C_I \geq 2\sqrt{C_I} \text{ or } C_P + C_I \leq -2\sqrt{C_I}.$$

Thus, real-valued poles are achieved in the region $$R_{REAL}(C_I, C_P) = \{C_I < C_P \text{ arbitrary}\} \cup \{C_I \geq 0, C_P \geq 2\sqrt{C_I} - C_I\} \cup \{C_I \geq 0, C_P \leq -2\sqrt{C_I} - C_I\}$$

and complex poles are achieved in the region $$R_{COMPLEX}(C_I, C_P) = R^2(C_I, C_P) - R_{REAL}(C_I, C_P).$$

For stable, real-valued poles, $$D \geq 0, \text{ and } |z| = \left|\frac{2 - C_P - C_I \pm \sqrt{D}}{2}\right| < 1.$$

Thus, the values of $C_I$ and $C_P$ must satisfy:

$$\underbrace{-2 < 2 - C_P - C_I + \sqrt{D} < 2}_{\text{Case1}} \text{ and } \underbrace{-2 < 2 - C_P - C_I - \sqrt{D} < 2}_{\text{Case2}}.$$

Case 1 holds true for:

$$\underbrace{2 - C_P - C_I + \sqrt{D} < 2}_{Case1.1} \text{ and } \underbrace{-2 < 2 - C_P - C_I + \sqrt{D}}_{Case1.2}.$$

For case 1.1:

$\sqrt{D} < C_P + C_I \Rightarrow$ $(C_P + C_I - 2)^2 < (C_P + C_I)^2 \Rightarrow$ $C_I > 0.$ For case 1.2:

$C_P + C_I - 4 < \sqrt{D}.$

This is trivially satisfied for:

$C_P + C_I - 4 < 0 = \Rightarrow$ $C_I < 4 - C_P.$

Therefore, assuming that:

$C_P + C_I - 4 \geq 0,$ then:

$(C_P + C_I - 4)^2 < (C_P + C_I - 2)^2 - 4(1 - C_P) \Rightarrow$ $C_I > 4 - 2C_P.$ Case 2 holds true for:

$$\underbrace{2 - C_P - C_I - \sqrt{D} < 2}_{Case2.1} \text{ and } \underbrace{-2 < 2 - C_P - C_I - \sqrt{D}}_{Case2.2}.$$

For case 2.1:

$-C_P - C_I < \sqrt{D}.$

This is trivially satisfied for:

$-C_P - C_I < 0 \Rightarrow$ $C_I > -C_P.$

Therefore, assuming that:

$-C_P - C_I \geq 0,$ then:

$(C_P + C_I)^2 < (C_P + C_I - 2)^2 - 4(1 - C_P) \Rightarrow$ $C_I > 0.$

For case 2.2:

$\sqrt{D} < 4 - C_P - C_I \Rightarrow$ $(C_P + C_I - 2)^2 - 4(1 - C_P) < (C_P + C_I - 4)^2 \Rightarrow$ $C_I < 4 - 2C_P.$ Combining the in-equalities established in Cases 1.1, 1.2, 2.1, and 2.2 for the region $R_{REAL}(C_I, C_P)$ results in the stable, real-pole region 610 indicated in FIG. 6. For stable, complex-valued poles, $D < 0, \text{ and } |z| = \left| \frac{2 - C_P - C_I \pm j\sqrt{-D}}{2} \right| < 1.$ Thus, $|2 - C_P - C_I + j\sqrt{-D}|^2 < 4 \Rightarrow$ $(C_P + C_I - 2)^2 + 4(1 - C_P) - (C_P + C_I - 2)^2 < 4 \Rightarrow$ $C_P > 0.$ Applying the above in-equality in the region $R_{COMPLEX}(C_I, C_P)$ results in the stable, complex-pole region 620 indicated in FIG. 6.

Therefore, the stability region 600, $R_{STABLE}(C_I, C_P)$, equals the triangular region:

$$R_{STABLE}(C_I, C_P) = \left\{ 0 < C_I < 4; 0 < C_P < \frac{C_I}{2} + 2 \right\},$$

depicted in FIG. 6.

From the stability region 600, $R_{STABLE}(C_I, C_P)$, it is difficult to arrive at an analytical, closed-form expression for the choice of optimal values of $K_I$ and $K_P$ for a number of reasons. First, many performance specifications exist for Bluetooth, and a determination of priority must be made among these specifications. Second, once a priority has been determined, the specific demodulator performance depends upon a manifold of variables in the receive path: analog IF-filter, I/Q LPFs, LPF/Equalizer, choice of sample rates, etc. Therefore, to reduce problem complexity, in accordance with embodiments of the invention, choices for the CDPLL gain parameters are made a-priori, and then the optimal CDPLL parameters are selected from these choices.

Figure 7:
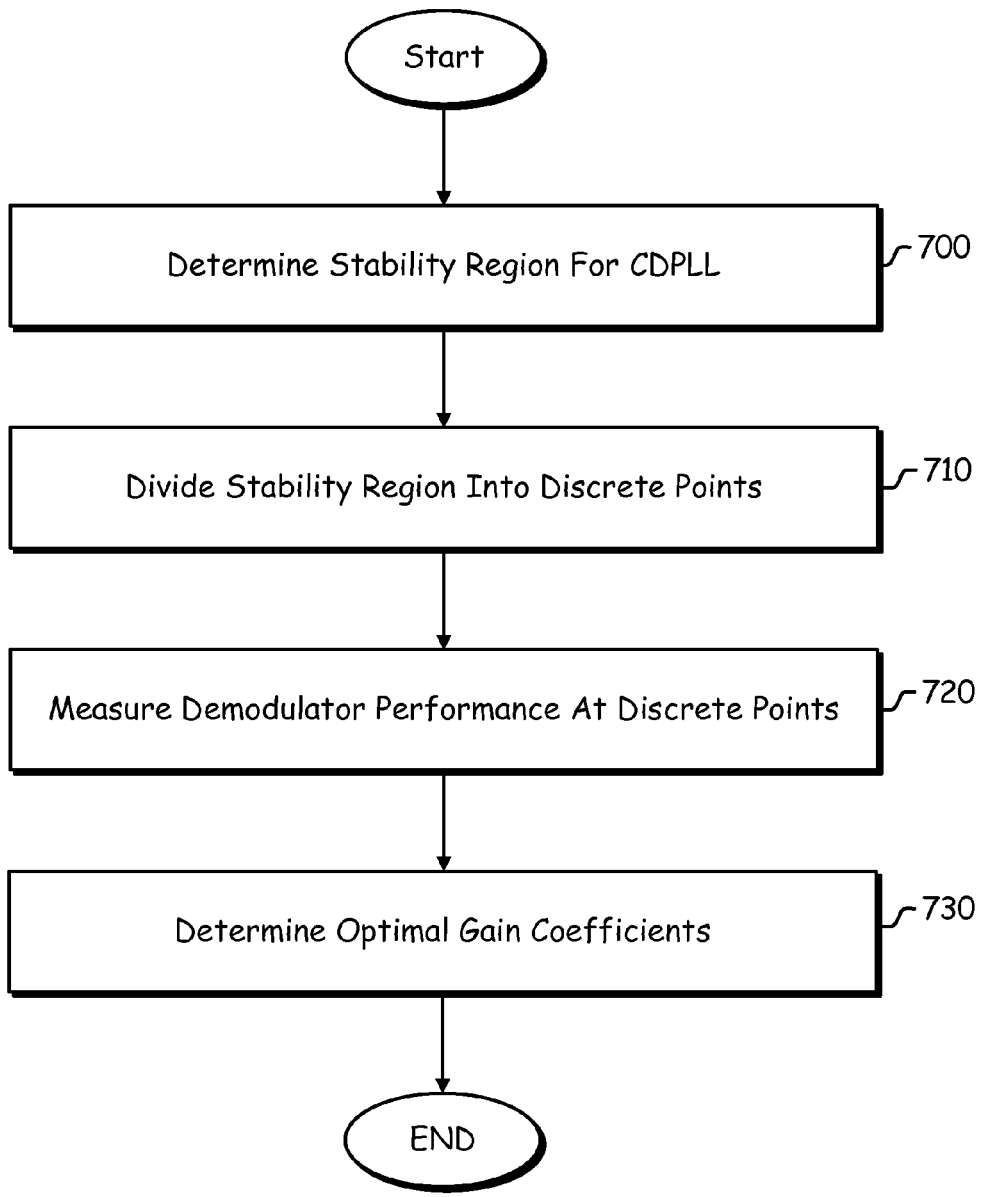
FIG. 7 is a flowchart illustrating one method of the present invention.

FIG. 7 is a flowchart illustrating one method of the present invention for selecting an optimal integration gain coefficient value $C_I$ and an optimal proportionality gain coefficient value $C_P$ of the CDPLL. Initially, a stability region in the complex plane associated with the CDPLL is determined as a function of integration gain coefficient values and proportionality gain coefficient values (step 700), such as the stability region shown in FIG. 6. Thereafter, the stability region is divided into discrete points, each representing a specific one of the integration gain coefficient values and a corresponding specific one of the proportionality gain coefficient values (step 710).

Figure 8:
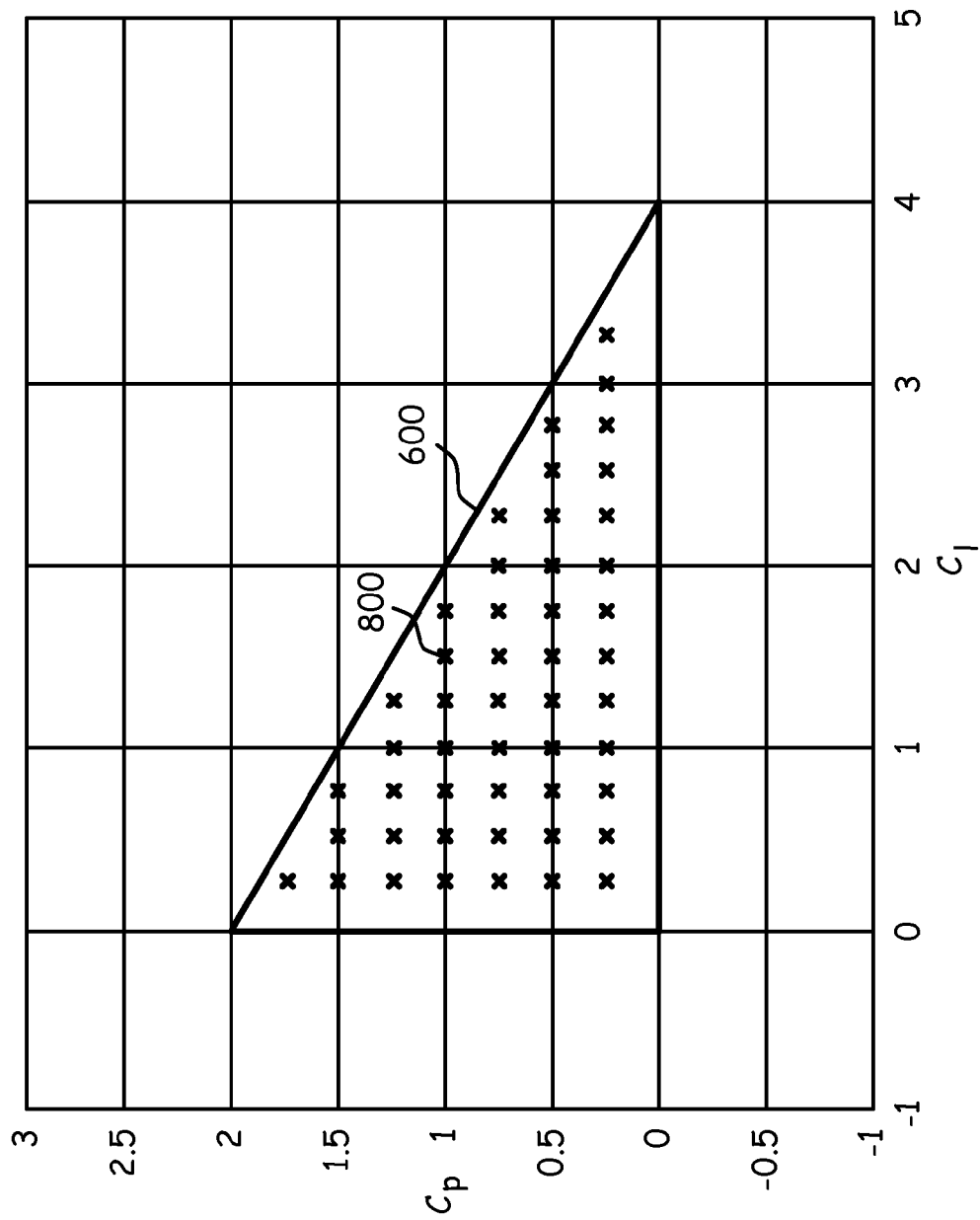
FIG. 8 is a graph illustrating exemplary discrete points of the stability region of FIG. 6 according to one embodiment of the present invention.

An example of discrete points is shown in FIG. 8. FIG. 8 is a graph illustrating an exemplary optimization region of the stability region of FIG. 6 according to one embodiment of the present invention. The optimization region includes a plurality of discrete points, corresponding to a gain parameter pair $(C_I, C_P)$. Referring again to FIG. 7, for each of the discrete points, the demodulator performance is measured under strenuous operating conditions (step 720), and the optimal the optimal integration gain coefficient value and the optimal proportionality gain coefficient value are chosen as the discrete point for which the best overall performance is observed (step 730).

Figure 9:
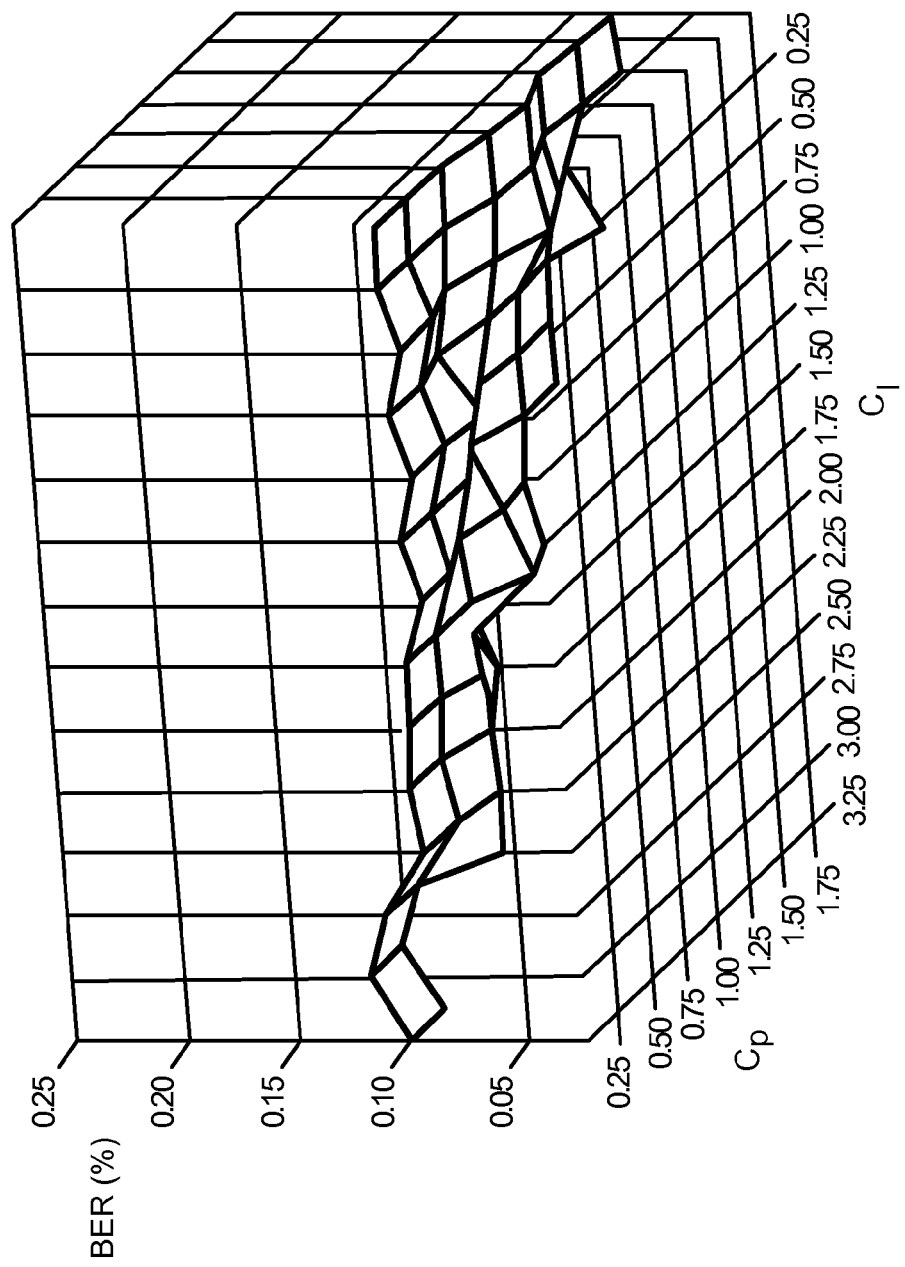
FIG. 9 is a graphical representation of exemplary bit error rate values for the discrete points in the stability region of FIG. 8 with a low signal to noise (SNR) ratio according to one embodiment of the present invention.
Figure 10:
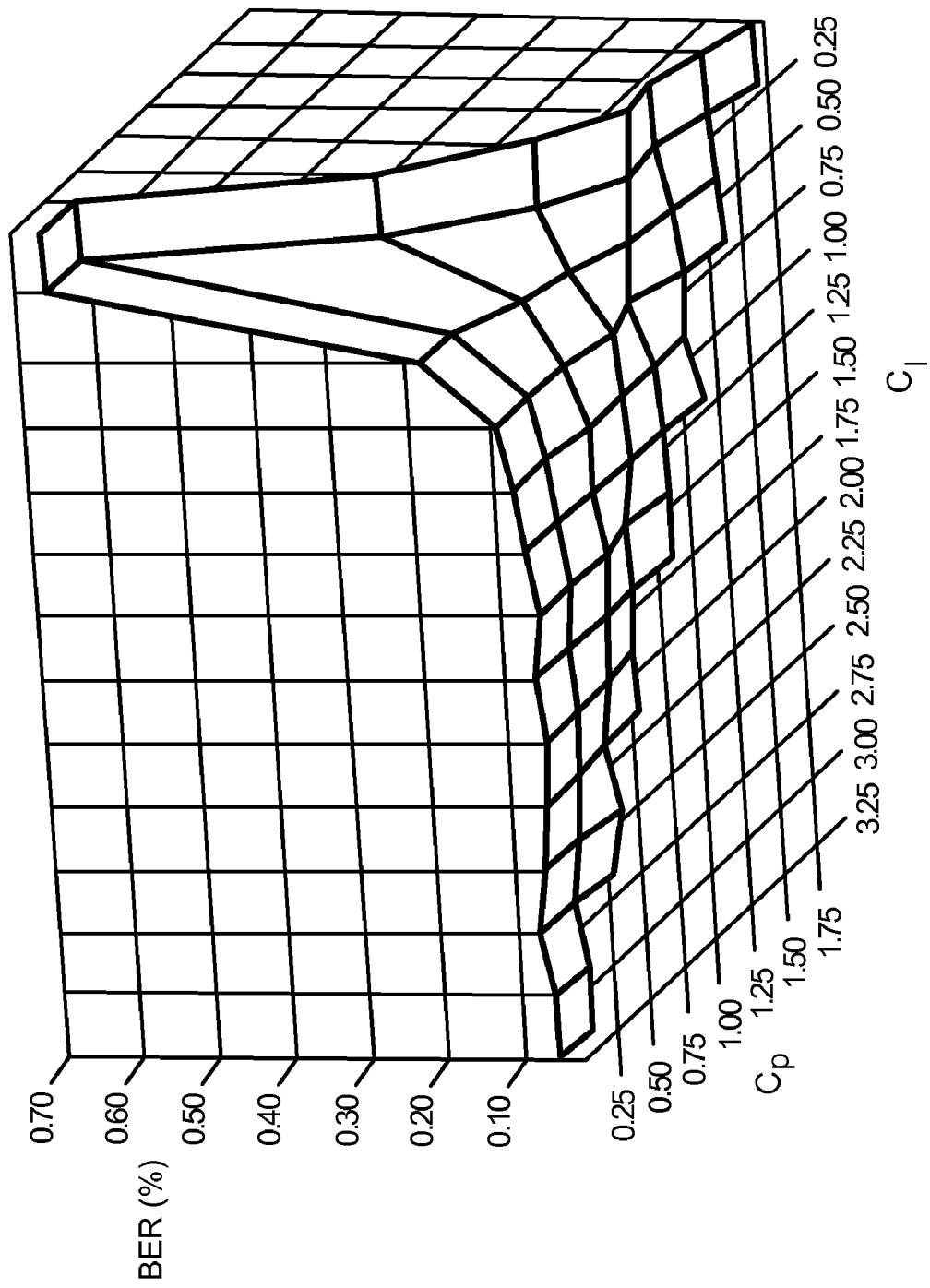
FIG. 10 is a graphical representation of exemplary bit error rate values for the discrete points in the stability region of FIG. 8 with adjacent channel interference according to one embodiment of the present invention.

Among the most important performance metrics are sensitivity and adjacent channel interference (ACI) rejection. In a simulation, for each discrete point 800 in the stability region 600 shown in FIG. 8, a total of 100,000 random bits were demodulated for the cases of low SNR (14.5 dB IF SNR) and high ACI (−3.5 dB). FIG. 9 is a graphical representation of exemplary bit error rate values for the discrete points 800 in the stability region 600 of FIG. 8 with a low signal to noise (SNR) ratio according to one embodiment of the present invention. FIG. 10 is a graphical representation of exemplary bit error rate values for the discrete points 800 in the stability region 600 of FIG. 8 with adjacent channel interference according to one embodiment of the present invention.

For these simulations, the transmitted signal was Gaussian FSK corresponding to a 520 kHz $4^{th}$ order Gaussian filter, a modulation index of 0.5 and a frequency offset of 30 kHz. FIG. 9 and FIG. 10 show BER vs. value of CDPLL gain parameters $(C_I, C_P)$ for 14.5 dB IF SNR and −3.5 dB ACI, respectively. In both cases, $K_{NCO}=1$. The minimum BER for 14.5 dB IF SNR of 0.08% is achieved for $(C_I, C_P)=(0.75, 1.50)$, while a minimum BER for −3.5 dB ACI of 0.05% is achieved for $(C_I, C_P)=(0.25, 1.75)$. Therefore, based on the results of these simulations, a near-optimal choice of gain parameters for the Bluetooth demodulator would be $(C_I, C_P)=(0.25, 1.75)$.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A complex digital phase locked loop for use in a demodulator, comprising:
    a phase detector connected to receive a complex digital input signal and a complex digital feedback signal, wherein the phase detector is operable to produce a phase error indicative of a difference in phase between the complex digital input signal and the complex digital feedback signal;
    a controller connected to receive the phase error, wherein the controller is operable to multiply the phase error by a gain factor selected to stabilize and optimize the complex digital phase locked loop and produce an output signal for use in extracting a frequency deviation present in the complex digital input signal by another component of the demodulator; and
    a numerically controlled oscillator connected to receive the output signal, wherein the numerically controlled oscillator is operable to track the phase of the complex digital input signal based on the output signal and produce the complex digital feedback signal;
    wherein the gain factor is selected from a set of gain parameters such that the steady-state response of the phase locked loop to a frequency-step change to the complex digital input signal is proportional to the magnitude of the frequency-step.

2. The phase locked loop of claim 1, wherein the gain factor is an integration gain factor, and wherein the controller further includes an integrator operable to integrate a product of the phase error and the integration gain factor to produce an integrated signal.

3. The phase locked loop of claim 2, wherein the controller further includes a first path connected to receive the phase error, the first path including the integration gain factor and the integrator, and a second path connected to receive the phase error, the second path including a proportionality gain factor selected to stabilize and optimize the phase locked loop and an additive node operable to add a product of the phase error and the proportionality gain factor and the integrated signal to produce the output signal.

4. The phase locked loop of claim 3, wherein the integration gain factor and the proportionality gain factor are selected from a discrete set of respective values corresponding to a stability region in the complex plane associated with the phase locked loop.

5. The phase locked loop of claim 1, wherein the numerically controlled oscillator includes an integrator connected to receive the output signal and an additional signal to remove intermediate frequencies from the output signal and produce an integrated signal, and wherein the numerically controlled oscillator further includes a look-up table for use in computing the complex digital feedback signal based on the integrated signal and an intrinsic gain of the numerically controlled oscillator.

6. The phase locked loop of claim 1, wherein the complex digital input signal includes an in-phase input signal and a quadrature-phase input signal and the complex digital feedback signal includes an in-phase feedback signal and a quadrature-phase feedback signal, and wherein the phase detector includes:
    a first digital multiplier connected to receive the in-phase input signal and the in-phase feedback signal, wherein the first digital multiplier is operable to multiply the in-phase input signal with the in-phase feedback signal to produce a first digital signal,
    a second digital multiplier connected to receive the quadrature-phase input signal and the quadrature-phase feedback signal, wherein the second digital multiplier is operable to multiply the quadrature-phase input signal with the quadrature-phase feedback signal to produce a second digital signal, and
    a subtraction node connected to receive the first digital signal and the second digital signal, wherein the subtraction node is operable to subtract the first digital signal from the second digital signal to produce the phase error.

7. The phase locked loop of claim 1, further comprising:
    a digital multiplier connected to receive the complex digital input signal and the complex digital feedback signal and operable to multiply the complex digital input signal with the complex digital feedback signal to produce a multiplied digital signal that is input to the phase detector.

8. The phase locked loop of claim 1, wherein the complex digital input signal is one of a complex digital radio frequency (RF) input signal, a complex digital Intermediate Frequency (IF) input signal or a complex digital baseband input signal.

9. A method for operating a complex digital phase locked loop within a digital demodulator, comprising:
    receiving a complex digital input signal and a complex digital feedback signal;
    producing a phase error indicative of a difference in phase between the complex digital input signal and the complex digital feedback signal;
    selecting a gain factor from a set of gain parameters such that the steady-state response of the complex digital phase locked loop to a frequency-step change to the complex digital input signal is proportional to the magnitude of the frequency-step;
    multiplying the phase error by the gain factor selected to stabilize and optimize the complex digital phase locked loop to produce a multiplied signal for use in extracting a frequency deviation present in the complex digital input signal by another component of the demodulator;

producing an output signal based on the multiplied signal, the output signal tracking the phase of the complex digital input signal; and producing the complex digital feedback signal from the output signal.

10. The method of claim 9, wherein the gain factor is an integration gain factor, and further comprising:

integrating a product of the phase error and the integration gain factor to produce an integrated signal.

11. The method of claim 10, further comprising:

adding a product of the phase error and a proportionality gain factor selected to stabilize and optimize the phase locked loop with the integrated signal to produce the output signal.

12. The method of claim 11, further comprising:

selecting the integration gain factor and the proportionality gain factor from a discrete set of respective values corresponding to a stability region in the complex plane associated with the phase locked loop.

13. The method of claim 9, further comprising:

integrating the multiplied signal and an additional signal selected to remove intermediate frequencies from the output signal to produce an integrated signal; and accessing a look-up table to compute the complex digital feedback signal based on the integrated signal.

14. The method of claim 9, wherein the complex digital input signal includes an in-phase input signal and a quadrature-phase input signal and the complex digital feedback signal includes an in-phase feedback signal and a quadrature-phase feedback signal, and further comprising:

multiplying the in-phase input signal with the in-phase feedback signal to produce a first digital signal, multiplying the quadrature-phase input signal with the quadrature-phase feedback signal to produce a second digital signal, and subtracting the first digital signal from the second digital signal to produce the phase error.

15. The method of claim 9, wherein the complex digital input signal is one of a complex digital radio frequency (RF) input signal, a complex digital Intermediate Frequency (IF) input signal or a complex digital baseband input signal.

* * * * *